United States Patent
Ong et al.

(10) Patent No.: US 7,036,387 B2
(45) Date of Patent: May 2, 2006

(54) INTEGRATED STRAIN GAGES FOR BOARD STRAIN CHARACTERIZATION

(75) Inventors: Brett C. Ong, San Jose, CA (US); Keith G. Newman, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/842,803

(22) Filed: May 11, 2004

(65) Prior Publication Data

US 2005/0252311 A1    Nov. 17, 2005

(51) Int. Cl.
*G01L 1/04*    (2006.01)
(52) U.S. Cl. .................. 73/862.637; 117/211; 73/763; 73/862.627
(58) Field of Classification Search ........... 73/862.044, 73/856, 763, 862.627; 345/161; 117/211
See application file for complete search history.

(56) References Cited

U.S. PATENT DOCUMENTS

| | | | |
|---|---|---|---|
| 5,392,027 A | 2/1995 | Brunot et al. | |
| 5,526,208 A | 6/1996 | Hatch et al. | |
| 5,872,320 A * | 2/1999 | Kamentser et al. | .... 73/862.044 |
| 6,131,512 A | 10/2000 | Verlinden et al. | |
| 6,469,537 B1 | 10/2002 | Akram et al. | |
| 6,681,640 B1 * | 1/2004 | Canumalla | ................... 73/856 |
| 6,788,291 B1 * | 9/2004 | Burry | ........................ 345/161 |

FOREIGN PATENT DOCUMENTS

| | | |
|---|---|---|
| JP | 2001015882 | 1/2001 |
| JP | 2001196721 | 7/2001 |
| WO | WO 2005/069707 | 7/2005 |

OTHER PUBLICATIONS

Strain Gages Imbedded in PC Board, Larry Marvet et. al., Motorola, Inc., 1996.*
Combined Search and Examination Report mailed Sep. 1, 2005; Application No. GB 0509633.

* cited by examiner

*Primary Examiner*—Edward Lefkowitz
*Assistant Examiner*—Linda P. Field
(74) *Attorney, Agent, or Firm*—Meyertons Hood Kivlin Kowert & Goetzel, P.C.; B. Noël Kivlin; Erik A. Heter

(57) ABSTRACT

A printed circuit board (PCB) having an integrated strain gage. In one embodiment, a PCB includes a component footprint suitable for mounting an electronic component. A strain gage is integrated into the PCB in a location under the component footprint. The strain gage includes at least one electrical conductor that is accessible for resistance measurements.

24 Claims, 6 Drawing Sheets

Lead Wires

Strain
Gage

INTEGRATED STRAIN GAGES FOR BOARD STRAIN CHARACTERIZATION

BACKGROUND OF THE INVENTION

1. Field of the Invention

This invention relates to printed circuit boards, and more particularly, a method and apparatus for measuring mechanical strain in a printed circuit board.

2. Description of the Related Art

During the manufacturing of electronic assemblies including printed circuit boards (PCB's), various processes may introduce mechanical strains. Some processes, such as a wave solder operation or an IR (infrared) reflow operation may strain a PCB thermally and thus cause the PCB to expand. Other processes such as in-circuit test (ICT) may strain the PCB mechanically, as an ICT often times requires the assembly to be secured in a caged fixture that is operated by a vacuum. Other manual handling processes may also result in mechanical strain.

The mechanical strain placed on a PCB during the manufacturing process of an electronic assembly must be kept within certain limits. If these limits are exceeded, the assembly may become damaged. For example, solder joints for surface mounted components such as ball-grid arrays (BGA's) or components mounted in plated-through holes (PTH's). Signal lines can also be damaged if the strain exceeds limits.

Strain gages are used to monitor the strain placed on a PCB during the manufacturing process of an electronic assembly. A strain gage is a device that is mounted to a PCB in a location at or near where the strain is to be measured. FIG. 1 is a drawing of two exemplary embodiments of a strain gage. Strain gages such as those illustrated in FIG. 1 include one or more conductive paths. The use of strain gages is based upon the principle that the resistance of a conductor will change when it is subjected to strain. Typically, when a conductor is stretched, it becomes longer and narrower, and therefore its resistance increases. Resistance measurements may be taken before, during, and after the strain gage is subjected to strain. These resistance measurements may be used to determine the strain encountered by the strain gage, and may also be used to determine the rate of strain. Resistance measurements are made by attaching resistance-measuring test equipment (e.g., a multi-meter) to the wire leads of the strain gage.

As noted above, strain gages may be mounted to a PCB in order to determine the amount of strain to which the PCB is subjected during the manufacturing process of an electronic assembly. FIG. 2 illustrates the mounting of strain gages on a PCB in the vicinity of a BGA footprint on the PCB. In the embodiment shown, strain gages are mounted on the PCB near each of the corners of a BGA footprint. More particularly, the strain gages may be attached to the PCB by the use of epoxy. Resistance measurements taken for each of the mounted strain gages may allow the approximation of the strain encountered on the PCB by the portion upon which the BGA is mounted. However, the locations of these strain gages, while close to the BGA footprint, are not ideal. Various factors, such as the thermal characteristics of the BGA solder balls, may limit the effectiveness of strain measurements at these points. Furthermore, the electrical conductors of typical strain gages (such as that shown in FIG. 1) are typically encased in a film-like material which has different characteristic than the PCB. Such materials may affect the amount the electrical conductor is stretched when placed under a process that induces strain. Another factor that must be considered to ensure accurate measurements is matching the coefficient of thermal expansion (CTE) of the strain gages with that of the electronic assembly of which the PCB is a part. Failure to match the CTE's with sufficient precision can further limit the accuracy of strain measurements.

Thus, with limited accuracy, the strain measurements taken at these locations may not yield a true picture of the strain encountered on the PCB at the BGA footprint. In embodiments where strain gages are attached using an epoxy, only a small sample of PCB's may be used for strain measurements.

SUMMARY OF THE INVENTION

A printed circuit board (PCB) having an integrated strain gage is disclosed. In one embodiment, a PCB includes a component footprint suitable for mounting an electronic component. A strain gage is integrated into the PCB in a location under the component footprint. The strain gage includes at least one electrical conductor that is accessible for resistance measurements.

In one embodiment, the component footprint is suitable for mounting a surface mounted component to the PCB. More particularly, in one embodiment, the component footprint may be suitable for mounting a ball-grid array (BGA) package. One or more strain gages may be integrated into the PCB underneath the component footprint. The one or more strain gages may be located on one or more layers of the PCB. Each of the one or more strain gages includes at least one electrical conductor, and the orientation of the conductor may be vertical or horizontal with respect to a surface of the PCB. In some embodiments, the electrical conductors of strain gages integrated into the PCB may also double as a signal trace capable of conveying a signal to or from a signal connection of an electronic component mounted on the component footprint.

An electronic assembly including a PCB an integrated strain gage and a component footprint with an electronic component mounted thereupon is also disclosed.

BRIEF DESCRIPTION OF THE DRAWINGS

Other aspects of the invention will become apparent upon reading the following detailed description and upon reference to the accompanying drawings in which.

Figure 1:
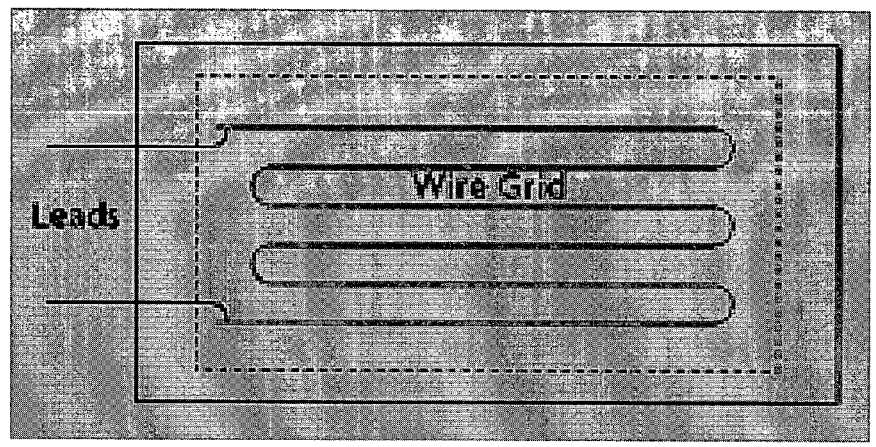
FIG. 1 (Prior Art) is a drawing of some exemplary embodiments of strain gages.
Figure 1:
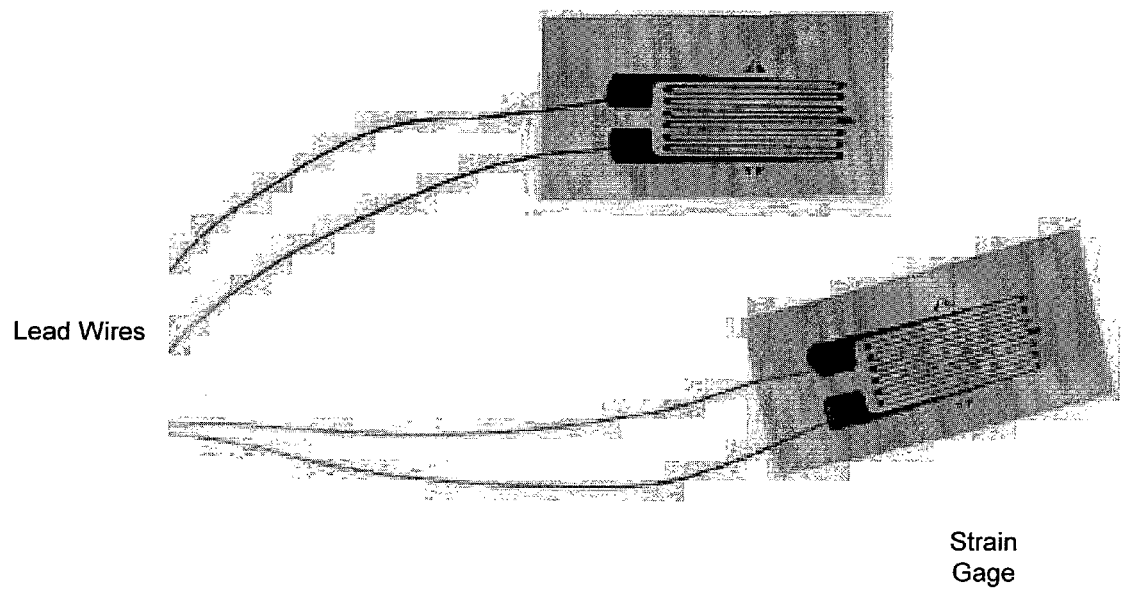
Figure 2:
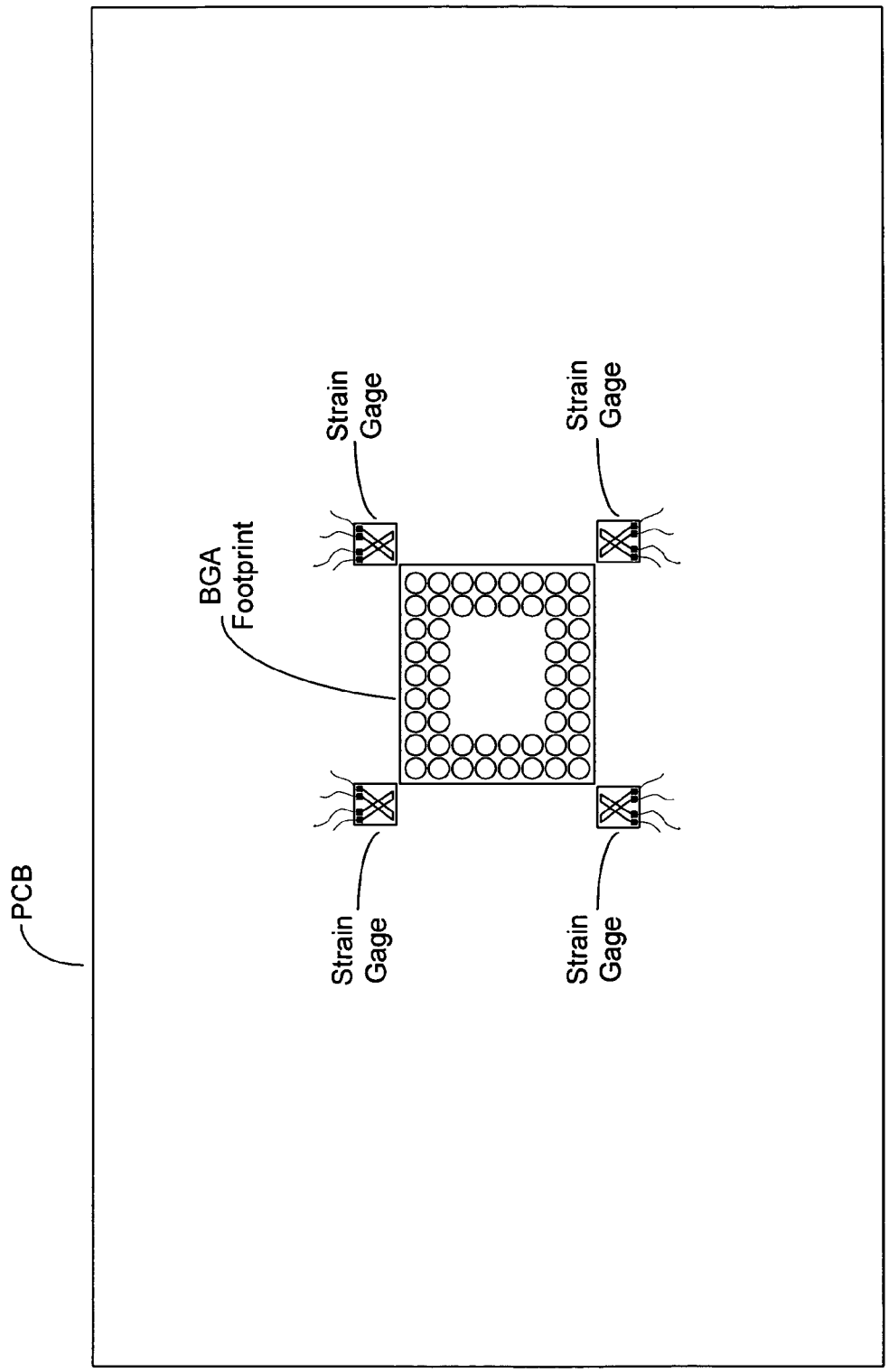
FIG. 2 (Prior Art) is a drawing which illustrates an embodiment wherein strain gages are placed on a PCB to measure strain near a component.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Figure 3:
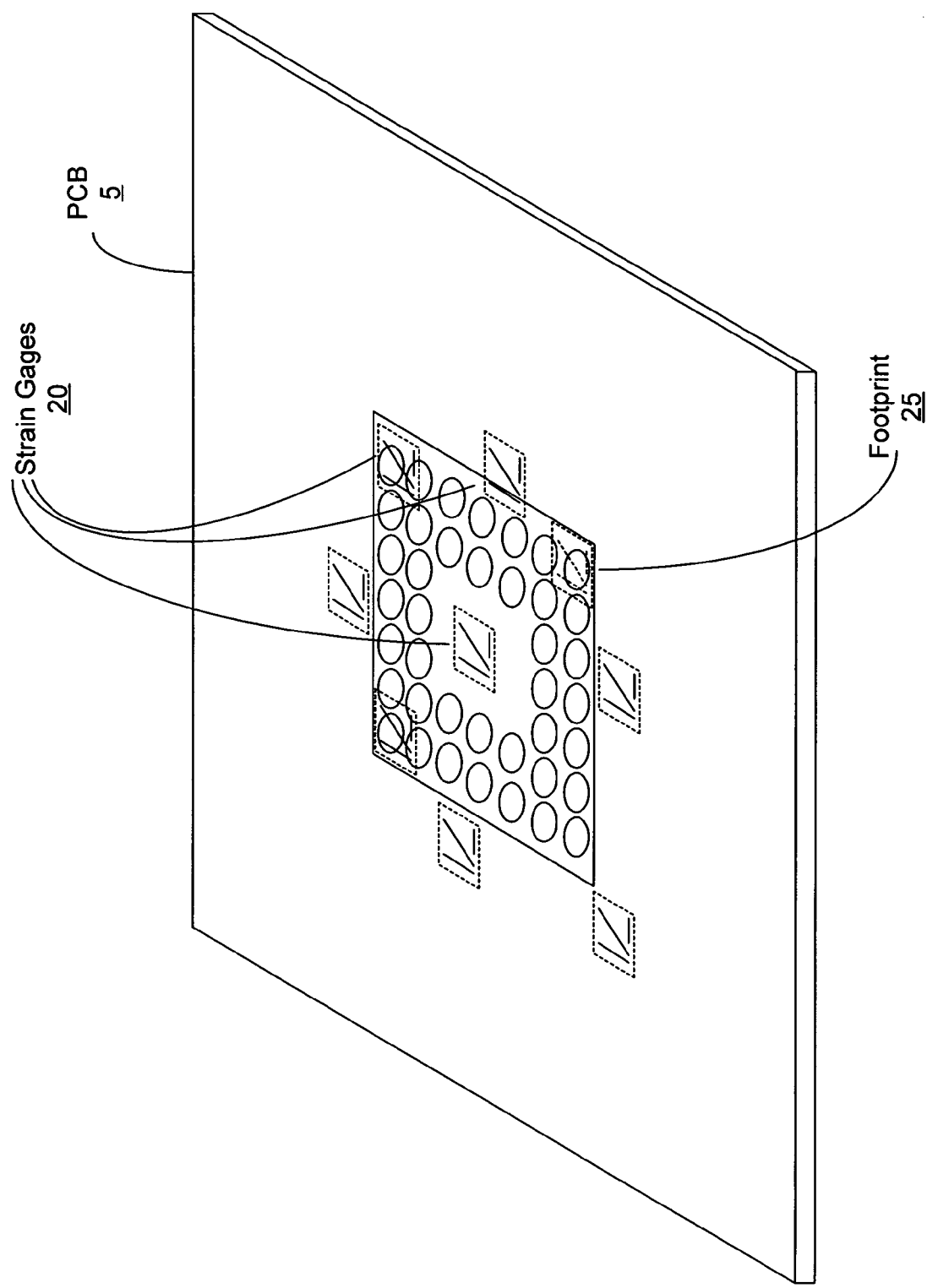
FIG. 3 is a drawing of one embodiment of a PCB having integrated strain gages.

Turning now to FIG. 3, a drawing of one embodiment of a PCB having integrated strain gages is shown. In the embodiment shown, three different strain gages 20 (denoted by dashed lines) are located primarily within an internal layer of PCB 5. Strain gages 20 may each include a conductor configuration of any one of many commonly available strain gages, including the strain gages shown in FIG. 1.

Strain gages 20 are located within the layers of PCB 5 in the vicinity of footprint 25. One of the strain gages 20 is located under footprint 25 in its entirety. Another one of strain gages 20 is located partially under footprint 25. A third strain gage 20 is located in the vicinity of footprint 25, although no part of this strain gage is actually under footprint 25. The actual locations of strain gages 20 in various embodiments may be determined in part by considerations such as signal routing density or other constraints.

Footprint 25 is a footprint suitable for mounting a surface mount component package, such as a BGA. Other embodiments wherein footprint 25 is suitable for mounting other types of electronic component packages, such as a quad flat pack, are also possible and contemplated. Footprint 25 includes a plurality of pads which conductive elements of the electronic component packaged may be attached by methods such as soldering. The pads may provide various types of electrical connections to an electronic component (e.g. and integrated circuit) housed by an electronic component package. Such connections include power, ground, and signal connections. Additionally, pads with no electrical connection may also be present in footprint 25.

In the embodiment shown, strain gage 20 includes a plurality of conductors having different directional orientations with respect to each other. The orientations may include multiple directions that are horizontal with respect to a surface of the PCB, as well as orientations that are substantially vertical with respect to the surface of the PCB. By having multiple conductors each having different orientations, the amount of strain induced into the PCB for different directions can be determined. Other embodiments of strain gage 20 may include multiple conductors having the same or similar orientations, thereby allowing the determination of variations of strain in the same direction from one portion of the board to another.

Strain gages at locations other than in the vicinity of the footprint are also possible and contemplated. Because of their proximity to the footprint 25, as well as because of their integration into PCB 5, strain gages 20 in the embodiment shown may allow for a more accurate measurement of strain encountered by PCB 5 than strain gages attached to the surface outside of the periphery of footprint 25. In addition, by integrating the strain gage into the PCB, the need to match the coefficient of thermal expansion with the electronic assembly is eliminated.

Figure 4:
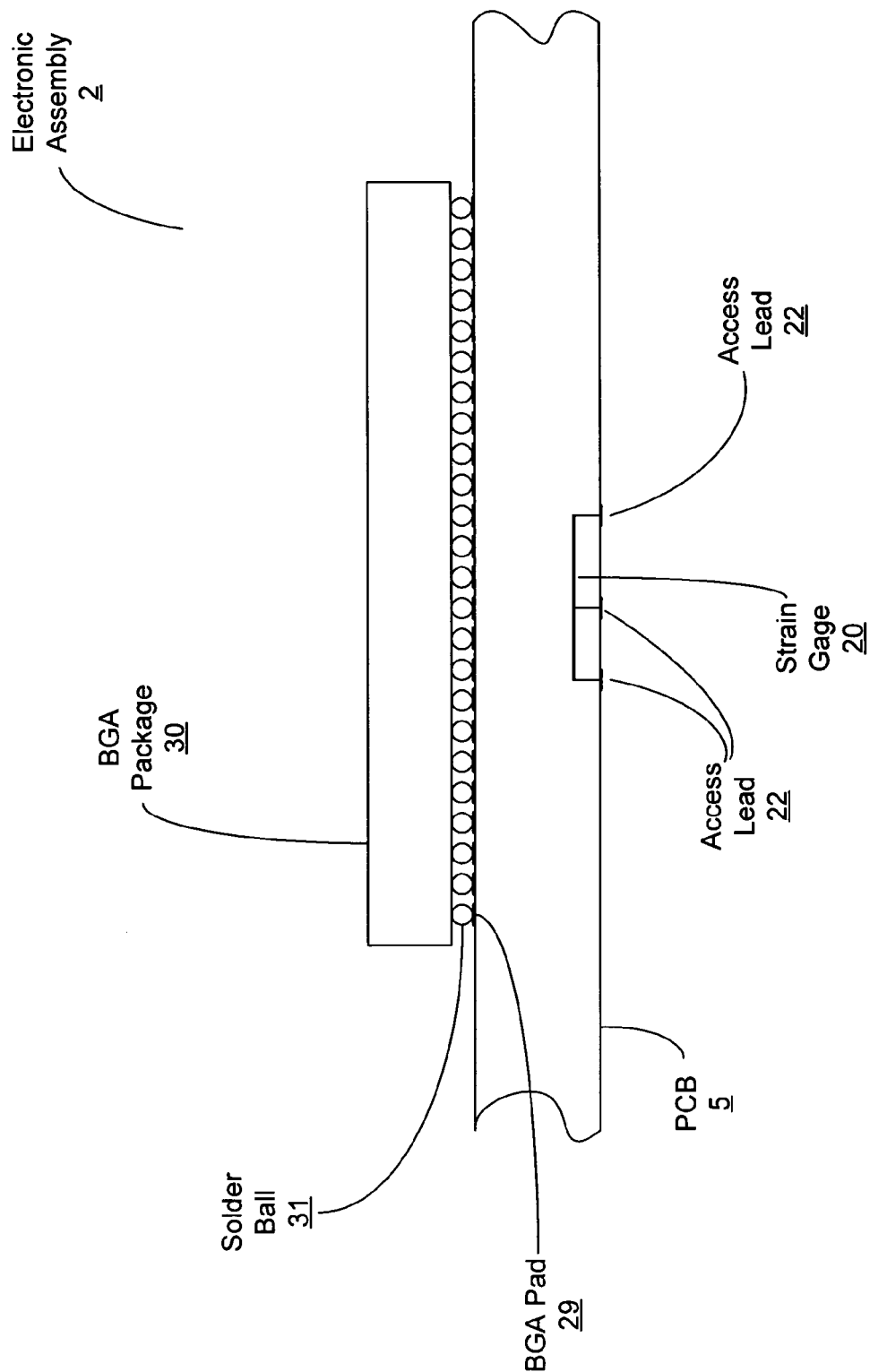
FIG. 4 is a drawing of another embodiment of a PCB having an integrated strain gage, wherein the strain gage is located in the PCB under a footprint upon which a BGA is mounted.

FIG. 4 is a drawing of another embodiment of a PCB having an integrated strain gage, wherein the strain gage is located in the PCB under a footprint upon which a BGA is mounted is shown. More particularly, FIG. 4 is a side view of a portion of electronic assembly 2, which includes PCB 5 having a BGA package 30 mounted thereupon. In the embodiment shown, PCB 5 includes a footprint having a plurality of BGA pads 29. A BGA package 30 is mounted on PCB 5, with solder balls 31 providing a bond between each of the BGA pads 29 and BGA package 30.

Strain gage 20 is integrated into PCB 5 at a location underneath the area defined by BGA pads 29 (i.e. footprint 25 of FIG. 3). In this particular embodiment, strain gage 20 is oriented horizontally with respect to the surface of PCB 5 upon which BGA pads 29 are located. Strain gage 20 is coupled to two access leads 22, which in this embodiment extend to the opposite surface of the BGA pads 29. Resistance measurements of strain gage 20 may be made by connecting the leads of a multi-meter or other type of resistance-measuring instrument to access leads 22. Each of access leads 22 may be terminated with pads on the surface of PCB 5 in order to allow a better connection to be made.

The conductive material used in a strain gage 20 may be virtually any type of conductive material. However, the type of conductive material used, as well as its particular size and shape in the strain gage implementation may is such that it will sufficiently deform (e.g., elongate) when strain is encountered by PCB 5, and thereby undergo a change in resistance. The conductive material, in one embodiment of a strain gage 20, may be formed by a chemical etch of copper foil. Other methods of forming the conductor of are possible and contemplated.

Resistance measurements to determine strain may be made before and after the strain-inducing process (thereby allowing a determination of the strain induced during the process), or even during the process (allowing the determination of the strain rate in addition to the overall strain). For example, if access leads 22 are coupled to pads that may be accessed by the probes of an in-circuit test (ICT) fixture, measurements of both strain and strain rate may be made during the performing of an ICT by programming the ICT test equipment to take multiple resistance measurements of strain gage 20.

Figure 5:
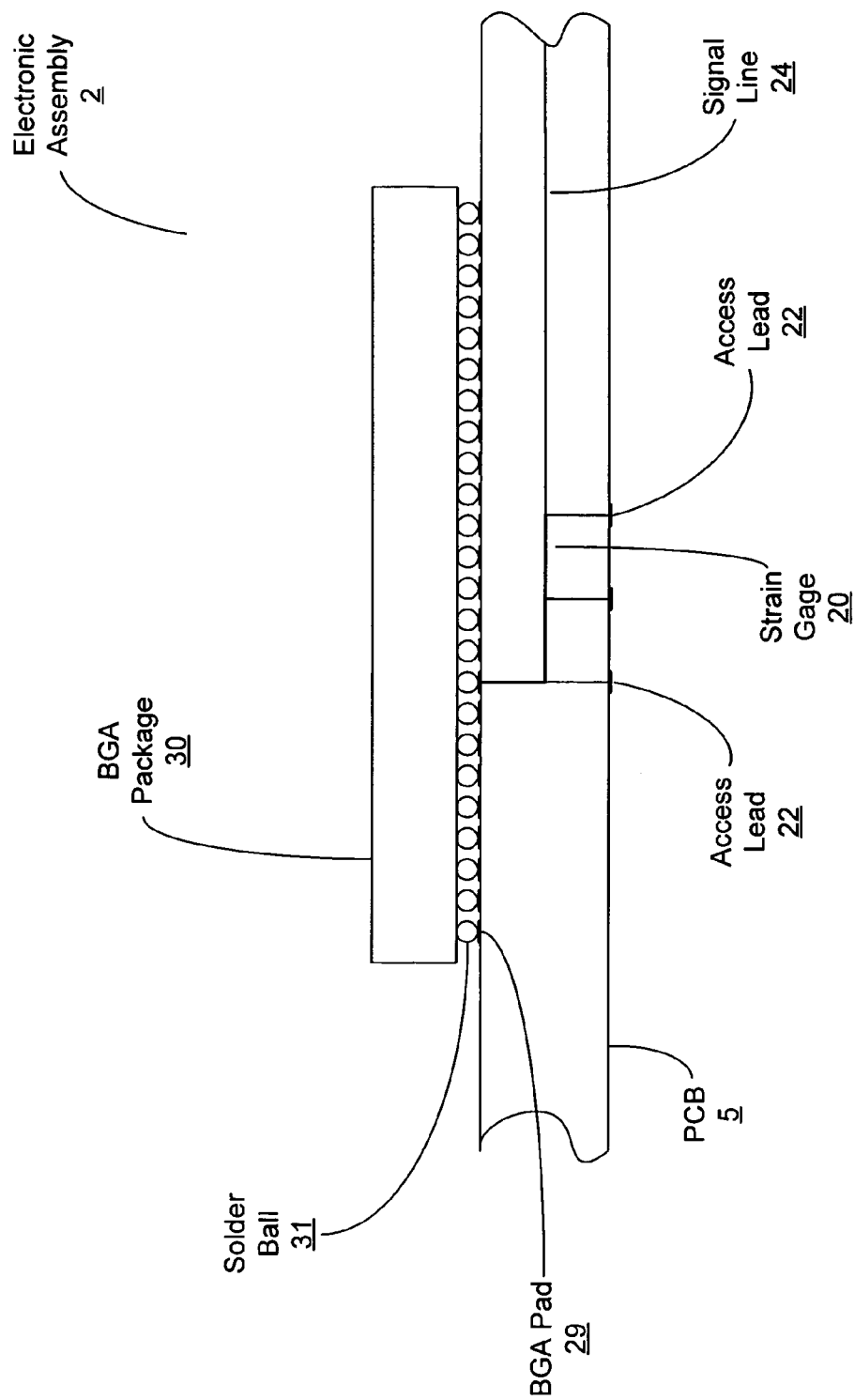
FIG. 5 is a drawing of another embodiment of a PCB having a BGA mounted thereupon, wherein a strain gage is integrated into the PCB and its conductive path doubles as a signal trace.

FIG. 5 is a drawing of another embodiment of a PCB having a BGA mounted thereupon, wherein a strain gage is integrated into the PCB and its conductive path doubles as a signal trace. In the embodiment shown, strain gage 20 is integrated into PCB 5. In addition to being coupled to access leads 22, strain gage 20 also doubles as a portion of a signal line. Strain gage 20 is electrically coupled, at one end, to a solder ball of BGA package 30. On the other end, strain gage 20 is coupled to signal line 24, which through which signals may be conveyed to and/or from the electronic circuit housed within BGA package 30. Thus, in this embodiment strain gage 20 effectively doubles as a signal trace for conveying signals between the electronic circuit of BGA 30 and other circuitry that may be part of electronic assembly 2.

Additional flexibility in the placement of a strain gage 20 may be gained by allowing it to double as a signal line. Strain gage 20, when doubling as a signal line, may be implemented on any layer of PCB 5 that includes signal lines. Thus, embodiments are possible and contemplated wherein multiple strain gages are implemented on different layers of PCB 5. Implementing a number of strain gages on different layers of PCB 5 may allow for a more complete picture of the strain induced during various manufacturing processes.

Figure 6:
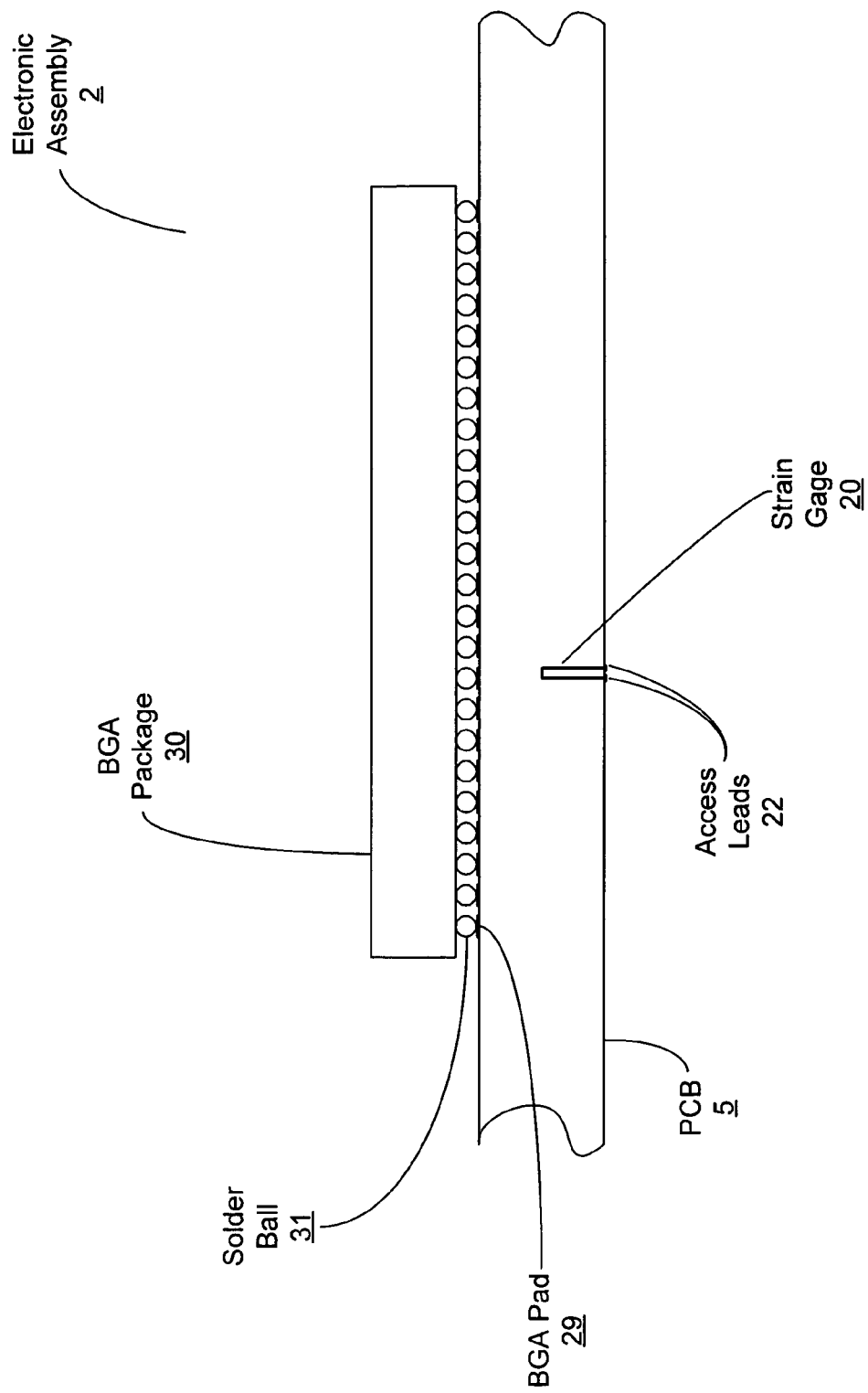
FIG. 6 is a drawing of another embodiment of a PCB having a BGA mounted thereupon, wherein a strain gage with a primarily vertical orientation is integrated into the PCB.

Turning now to FIG. 6, a drawing of another embodiment of a PCB having a BGA mounted thereupon, wherein a strain gage with a primarily vertical orientation is integrated into the PCB is shown. In the embodiment shown, a strain gage 20 having a primarily vertical orientation (with respect to the upper and lower surfaces) is integrated into PCB 5. Only a small portion of the conductive element of strain gage 20 has a horizontal orientation. The remainder of strain gage 20 includes two vertically oriented conductors connected by the horizontal portion. Resistance measurements of this embodiment of strain gage 20 can be taken via access leads/pads 23, located on the bottom surface of PCB 5.

Printed circuit boards such as PCB 5 are typically constructed of laminated layers of various materials, such as fiberglass and copper (e.g., for power and ground planes). During various manufacturing processes, particularly those where heat is applied, strain may be induced into PCB 5 in a vertical direction as well as a horizontal direction. If the strain exceeds certain limits, the various layers of PCB 5 may become delaminated, which may result in the necessity to scrap the assembly that PCB 5 is a part of. The embodiment of strain gage 20 shown in FIG. 6 may be particularly useful for measuring the vertical strain and thereby determining whether or not the PCB is in danger of becoming delaminated.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A printed circuit board (PCB) comprising:
   a component footprint suitable for mounting an electronic component, the component footprint having a plurality of pads; and
   a strain gage, wherein at least a portion of the strain gage is integrated into at least one layer internal to the PCB in the vicinity of the component footprint, wherein the strain gage includes at least one electrical conductor accessible on a surface of the PCB for resistance measurements.

2. The PCB as recited in claim 1, wherein the component footprint is suitable for mounting a surface mount electronic component, and wherein the strain gage is located within the PCB at least partially underneath the component footprint.

3. The PCB as recited in claim 2, wherein the component footprint is a ball-grid array (BGA) footprint.

4. The PCB as recited in claim 1, wherein the electrical conductor is electrically coupled to an electrically conductive pad of the component footprint.

5. The PCB as recited in claim 4, wherein the electrical conductor doubles as a signal trace for conveying a signal to and/or from an electronic component mounted to the component footprint.

6. The PCB as recited in claim 1, wherein the strain gage includes a plurality of conductors, wherein each of the plurality of conductors has a different directional orientation with respect to other ones of the plurality of conductors.

7. The PCB as recited in claim 6, wherein at least one of the plurality of conductors is vertically oriented with respect to surface layers of the PCB.

8. The PCB as recited in claim 6, wherein at least one of the plurality of conductors is horizontally oriented.

9. The PCB as recited in claim 1, wherein a plurality of strain gages are integrated into the PCB.

10. An electronic assembly comprising:
    a printed circuit board (PCB), wherein the PCB includes a component footprint suitable for mounting an electronic component, the component footprint having a plurality of pads, and a strain gage, wherein at least a portion of the strain gage is integrated into at least one layer internal to the PCB, in the vicinity of component footprint, and wherein the strain gage includes at least one electrical conductor accessible on a surface of the PCB for resistance measurements; and
    an electronic component mounted on the component footprint of the PCB.

11. The electronic assembly as recited in claim 10, wherein the component footprint is suitable for mounting a surface-mounted component, and wherein the strain gage is located within the PCB at least partially underneath the component footprint.

12. The electronic assembly as recited in claim 11, wherein the surface-mounted component is a ball-grid array (BGA) package.

13. The electronic assembly as recited in claim 10, wherein the electrical conductor is electrically coupled to an electrically conductive pad of the component footprint.

14. The electronic assembly as recited in claim 13, wherein the electrical conductor doubles as a signal trace for conveying a signal to and/or from an electronic component mounted to the component footprint.

15. The electronic assembly as recited in claim 10, wherein the strain gage includes a plurality of conductors, wherein each of the plurality of conductors has a different directional orientation with respect to other ones of the plurality of conductors.

16. The electronic assembly as recited in claim 15, wherein at least one of the plurality of conductors is vertically oriented with respect to a surface of the PCB.

17. The electronic assembly as recited in claim 15, wherein at least one of the plurality of conductors is horizontally oriented with respect to a surface of the PCB.

18. The electronic assembly as recited in claim 10, wherein a plurality of strain gages are integrated into the PCB.

19. A method comprising:
    providing a printed circuit board (PCB), wherein the PCB includes a component footprint suitable for mounting an electronic component;
    integrating at least a portion of a strain gage into at least one layer internal to the PCB in the vicinity of the component footprint, wherein the strain gage includes at least one electrical conductor accessible on a surface of the PCB for resistance measurements.

20. The method as recited in claim 19, further comprising mounting an electronic component on the component footprint, wherein the strain gage is located within the PCB at least partially underneath the component footprint.

21. The method as recited in claim 20, wherein the component footprint is suitable for mounting a surface-mount component.

22. The method as recited in claim 21, wherein the electronic component is packaged in a ball-grid array package.

23. The method as recited 19 further comprising integrating a plurality of strain gages into the PCB.

24. The method as recited in claim 19, wherein the at least one electrical conductor doubles as a signal trace.

* * * * *